(12) United States Patent  
Ge

(10) Patent No.: US 8,344,814 B2
(45) Date of Patent: Jan. 1, 2013

(54) CIRCUIT AND METHOD FOR GENERATING A CLOCK SIGNAL

(75) Inventor: Henry Ge, Shenzhen (CN)

(73) Assignee: STMicroelectronics (Shenzhen) R&D Co. Ltd., Shenzhen (CN)

( * ) Notice: Subject to any disclaimer, the term of this patent is extended or adjusted under 35 U.S.C. 154(b) by 49 days.

(21) Appl. No.: 12/975,125

(22) Filed: Dec. 21, 2010

(65) Prior Publication Data

US 2011/0156821 A1 Jun. 30, 2011

(30) Foreign Application Priority Data

Dec. 30, 2009 (CN) .......................... 2009 1 0260777

(51) Int. Cl.
*H03L 7/00* (2006.01)
*H03B 5/32* (2006.01)
*G04B 17/00* (2006.01)
(52) U.S. Cl. ........ 331/36 C; 331/158; 331/44; 368/200; 368/202

(58) Field of Classification Search ................. 331/158, 331/116 R, 116 FE, 44, 1 R, 34, 36 C, 177 R, 331/177 V; 368/159, 200–202
See application file for complete search history.

(56) References Cited

U.S. PATENT DOCUMENTS

| 4,427,302 A | * | 1/1984 | Watanabe ...................... 368/200 |
| 4,730,286 A | * | 3/1988 | Aizawa et al. ................ 368/202 |
| 2009/0160569 A1 | * | 6/2009 | Gros ............................. 331/176 |
| 2011/0012686 A1 | * | 1/2011 | Ruffieux .................. 331/116 R |

* cited by examiner

*Primary Examiner* — Ryan Johnson
(74) *Attorney, Agent, or Firm* — Seed IP Law Group, PLLC

(57) ABSTRACT

A circuit comprises a frequency divider configured to receive an oscillating signal generated by an oscillator and to divide the oscillating signal into a clock signal, wherein the division ratio of the frequency divider is set to a value equal to one of: the integer part of the resonant frequency of the oscillator and the integer part of the resonant frequency of the oscillator plus 1. The circuit further comprises a control element which switchable connects or disconnects a calibration element to alter the frequency of the oscillation signal input to the frequency divider based on a number of oscillations that have transpired in the oscillating signal.

20 Claims, 7 Drawing Sheets ically, and do
not limit the scope of the disclosure.

CIRCUIT AND METHOD FOR GENERATING A CLOCK SIGNAL

BACKGROUND

1. Technical Field

This disclosure relates generally to electronic circuits, and more particularly to a circuit and method for generating a clock signal, as well as a real time clock device comprising the circuit for generating a clock signal.

2. Description of the Related Art

A crystal oscillator is an electronic circuit that uses the mechanical resonance of a vibrating crystal of piezoelectric material to create an electrical signal with a very precise frequency. This frequency is commonly used to keep track of time (as in quartz wristwatches), to provide a stable clock signal for digital integrated circuits, and to stabilize frequencies for radio transmitters and receivers. The most common type of piezoelectric resonator is the quartz crystal, so oscillator circuits based on the crystal are called "crystal oscillators".

Every quartz crystal has a unique resonant frequency that depends on the specifics of its manufacturing, for example, the cut angle of its crystal blank. The greater the angle error, the greater the difference between the resonant frequency and the nominal frequency will be. Furthermore, environmental changes of temperature, humidity, pressure, and vibration can also change the resonant frequency of a quartz crystal, and may lead to degraded accuracy of the time information or clock signal in systems which, for example, may include a real time clock (RTC) device, a communication terminal and so on.

One approach that has been used to compensate for the time or signal error is adjusting the frequency at which the crystal oscillator oscillates by adding additional capacitive load across a crystal. Another approach that has been used is periodically modifying the frequency by deleting or inserting clock pulses into the clock signal. These approaches result in an accuracy that is not much better than 3-5 ppm, that is, 3-5 µs of error.

Thus, there is a need for a circuit and a method for generating a clock signal with higher accuracy.

BRIEF SUMMARY

In one embodiment, a circuit is disclosed. The circuit comprises a frequency divider configured to receive an oscillating signal generated by an oscillator and to divide the oscillating signal into a clock signal, wherein the division ratio of the frequency divider is set to a value equal to one of: the integer part of the resonant frequency of the oscillator, and the integer part of the resonant frequency of the oscillator plus 1.

In another embodiment, a real time clock device is disclosed. The real time clock device comprises a circuit that comprises a frequency divider configured to receive an oscillating signal generated by an oscillator and to divide the oscillating signal into a clock signal, wherein the division ratio of the frequency divider is set to a value equal to one of: the integer part of the resonant frequency of the oscillator, and the integer part of the resonant frequency of the oscillator plus 1.

In a further embodiment, a method is disclosed. The method comprises dividing an oscillating signal generated by an oscillator into a clock signal, wherein the division ratio is set to a value equal to one of: the integer part of the resonant frequency of the oscillator, and the integer part of the resonant frequency of the oscillator plus 1.

The foregoing has outlined, rather broadly, features of the present disclosure. Additional features of the disclosure will be described, hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure.

BRIEF DESCRIPTION OF THE SEVERAL VIEWS OF THE DRAWINGS

For a more complete understanding of the present disclosure, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present disclosure and are not necessarily drawn to scale. To more clearly illustrate certain embodiments, a letter indicating variations of the same structure, material, or process step may follow a figure number.

DETAILED DESCRIPTION

The making and using of embodiments are discussed in detail below. It should be appreciated, however, that the specific embodiments discussed are merely illustrative, and do not limit the scope of the disclosure.

Figure 1:
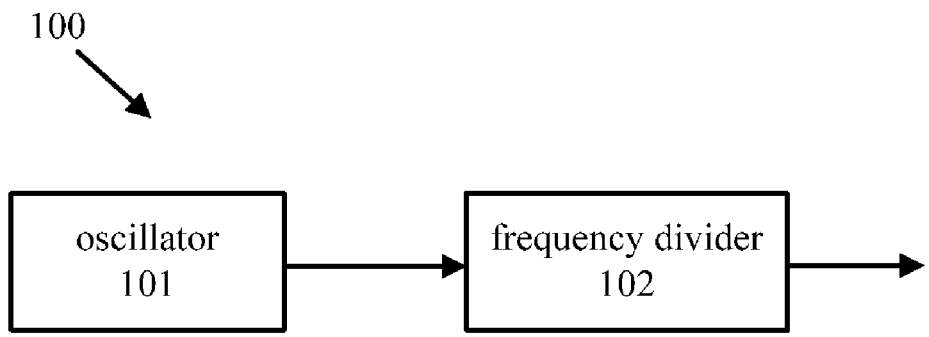
FIG. 1 illustrates a circuit for generating a clock signal according to one embodiment.

FIG. 1 illustrates a circuit 100 for generating a clock signal according to one embodiment. The circuit 100 comprises an oscillator 101 and a frequency divider 102 that is coupled to the oscillator 101.

Figure 2:
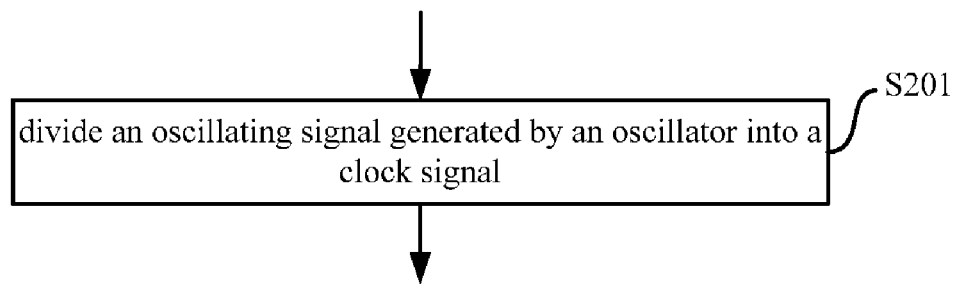
FIG. 2 illustrates a flow chart of generating a clock signal according to an embodiment.

Hereinafter, the operation of circuit 100 in FIG. 1 will be elaborated by referring to the flow chart of generating a clock signal shown in FIG. 2.

In process S201, the frequency divider 102 receives the oscillating signal generated by the oscillator 101 and divides the oscillating signal into a clock signal. The division ratio of the frequency divider 102 is set to a value equal to the integer part of the resonant frequency of the oscillator 101 or equal to the integer part of the resonant frequency of the oscillator 101 plus 1. Accordingly, if the resonant frequency of the oscillator 101 were 32771.45, the division ratio may be set to 32771 or 32772, the integer value of the frequency and the integer value of the frequency plus 1, respectively.

It will be appreciated that in another embodiment of the circuit 100, the oscillator 101 can be an external component and is not included in the circuit 100.

In an embodiment, the oscillator 101 comprises one or a plurality of amplifiers and a feedback network to provide frequency selection. To be specific, in one embodiment, the feedback network can include mechanical resonators, for example, quartz crystals or ceramic resonators. Alternatively, phase shift circuits including resistors and capacitors can be used in the feedback network.

The oscillation source, for example, a quartz crystal comprised in the oscillator 101 has a nominal frequency, and however, due to specifics of manufacturing and the environmental changes of, for example, temperature, humidity, pressure, and vibration, the actual resonant frequency of the oscillator 101 may be different from the nominal frequency. For instance, the actual resonant frequency of the oscillator 101 that comprises a quartz crystal with the nominal frequency of 32768 Hz may be 32771.45 Hz due to the specifics of manufacturing. The actual resonant frequency of the oscillator 101 can be measured on chip, for example, by comparison to a stable, high frequency signal, or measured off chip, for example, by an oscilloscope.

In one embodiment, the oscillator comprises a low speed internal oscillator. The low speed internal oscillator may be coupled in parallel to an inverter to facilitate operation.

In one embodiment, the frequency divider 102 is a programmable divide-by-n counter comprising cascaded flip-flops. The frequency divider 102 can be programmed, for example, by storing a desired division ratio n in a register accessible to end users. The flip-flops toggle, i.e., change state, on each rising edge and/or falling edge of the input oscillating signal. Once the state corresponding to the division ratio n is detected, the frequency divider 102 outputs a clock pulse and the flip-flops are reset at the same time. In this way, the count value between reset pulses is n.

The division ratio of the frequency divider 102 may be adjustable and set based on the resonant frequency of the oscillator 101. When the actual resonant frequency of the oscillator 101 is for example 32771.45 Hz, the division ratio of the frequency divider 102 may be set to 32771 or 32772.

The upper frequency limit of the frequency divider 102 is designed according to the actual resonant frequency of the oscillator 101. For an x-bit frequency divider 102, the "x" should be chosen so that the actual resonant frequency of the oscillator 101 is within the range from 0 to $2^x-1$, wherein the "x" is an integer". In an embodiment, the frequency divider 102 is a programmable 16-bit prescaler with the division ratio of any integer between 0 and 65535.

Figure 3:
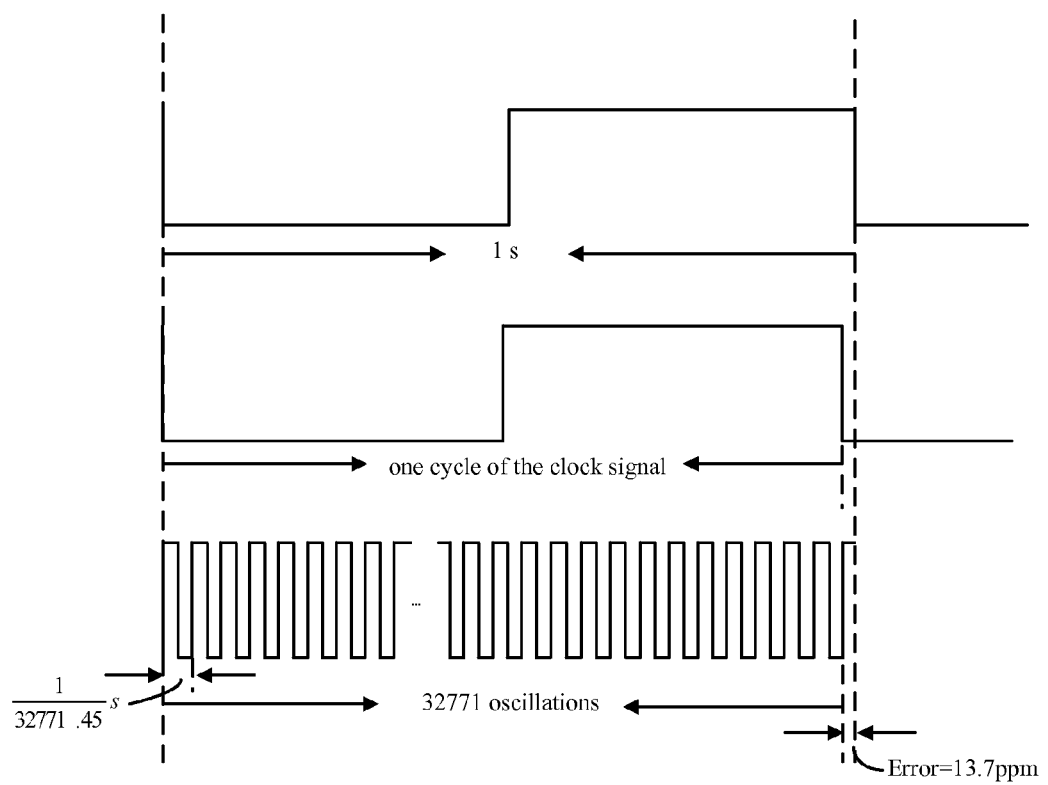
FIG. 3 illustrates the waveform of the clock signal of FIG. 1.

As shown in FIG. 3, it is taken as an example that the actual resonant frequency of the oscillator 101 denoted by $f_1$ is 32771.45 Hz and the division ratio of the frequency divider 102 denoted by n is 32771. The clock signal generated by the frequency divider 102 is with an approximate frequency of 1 Hz and the error of the clock signal is $$1 - \frac{n}{f_1} = 1 - \frac{32771}{32771.45} \approx 13.7 \text{ ppm } (13.7 \text{ μs}).$$

The error calculated may simply be the difference between a desired 1 second output and the actual period of the output of the frequency divider 102.

Figure 4:
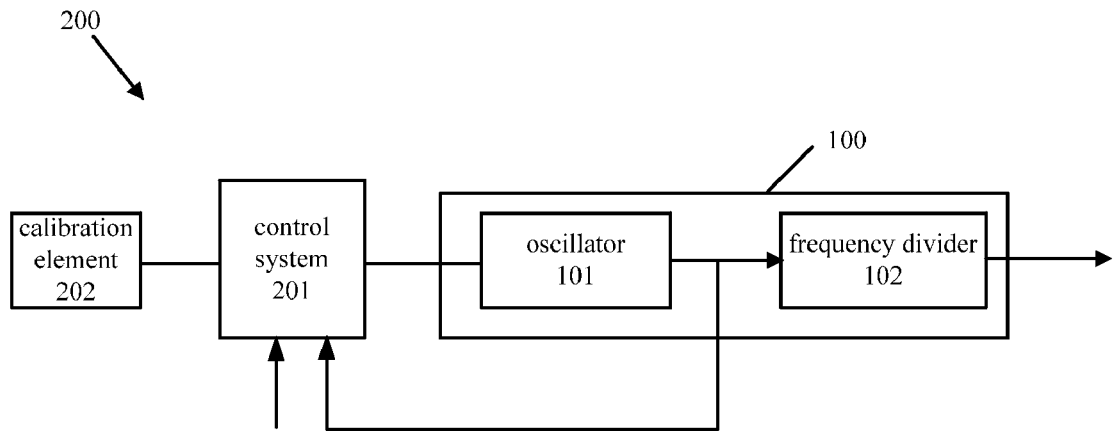
FIG. 4 illustrates a circuit for generating a clock signal according to another embodiment.

FIG. 4 illustrates a circuit 200 for generating a clock signal according to another embodiment. As shown in FIG. 4, an embodiment of the circuit 200 comprises the circuit 100 of FIG. 1, a control system 201 and a calibration element 202.

Figure 5:
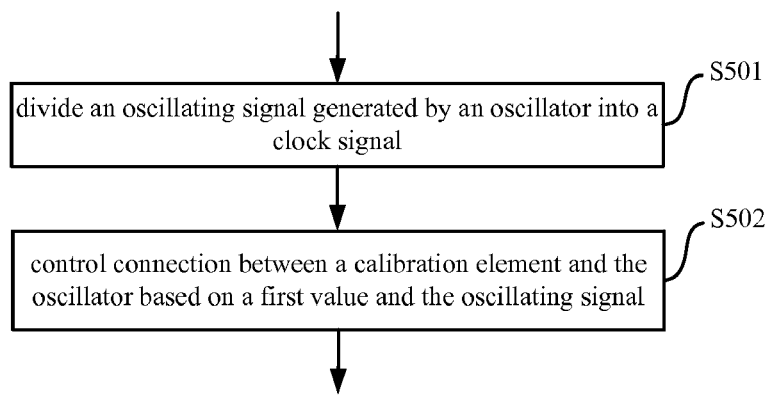
FIG. 5 illustrates a flow chart of generating a clock signal according to another embodiment.

Hereinafter, the operation of circuit 200 in FIG. 4 will be elaborated by referring to the flow chart of generating a clock signal shown in FIG. 5.

In process S501, the frequency divider 102 may be coupled to the oscillator 101 to receive the oscillating signal and divide the oscillating signal into a clock signal. The division ratio of the frequency divider 102 may be set to a value equal to the integer part of the resonant frequency of the oscillator 101 or equal to the integer part of the resonant frequency of the oscillator 101 plus 1.

It will be appreciated that in another embodiment of the circuit 200, the oscillator 101 can be an external component and is not included in the circuit 200.

In process S502, the control system 201 controls connection between the calibration element 202 and the oscillator 101 based on a first value and the oscillating signal generated by the oscillator 101.

Figure 6:
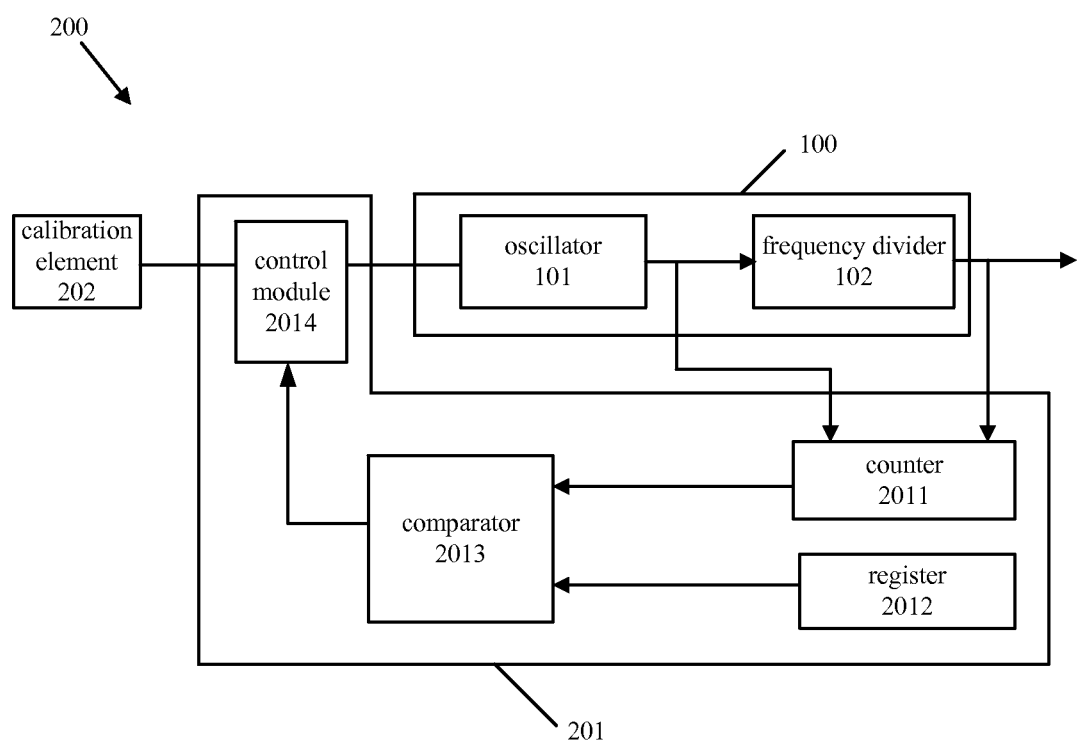
FIG. 6 illustrates an embodiment of the circuit of FIG. 4.

In an embodiment, the first value is set to an integer closest to $f_1*(n-f_2)/(f_1-f_2)$, wherein $f_1$ denotes the frequency of the oscillating signal when the calibration element 202 is disconnected from the oscillator 101, $f_2$ denotes the frequency of the oscillating signal when the calibration element 202 is connected to the oscillator 101 and n denotes the division ratio of the frequency divider 102. In an embodiment, as shown in FIG. 6, the control system 201 comprises a counter 2011, a register 2012, a comparator 2013, a control module 2014.

Figure 7:
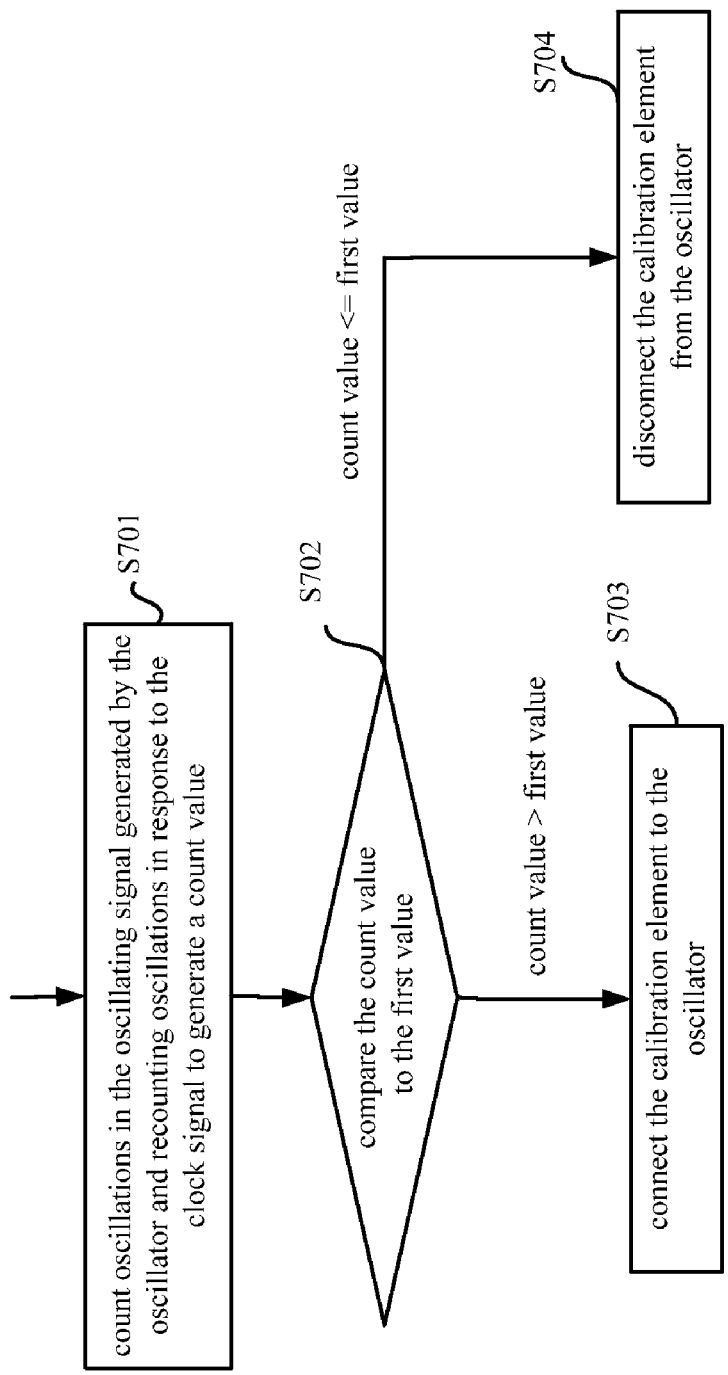
FIG. 7 illustrates a flow chart of the process of the control system illustrated in FIG. 6 according to an embodiment.

Hereinafter, the operation of the control system 201 in FIG. 6 will be elaborated by referring to the flow chart shown in FIG. 7.

The counter 2011 is coupled to the oscillator 101 and the frequency divider 102 to respectively receive the oscillating signal generated by the oscillator 101 and the clock signal generated by the frequency divider 102.

In process S701, the counter 2011 counts oscillations in the oscillating signal and is reset in response to the clock signal. In an embodiment, the counter 2011 counts oscillations in the oscillating signal and is reset at the rising edge or the falling edge of the clock signal. The count value output from the counter 2011 is applied to a first, for example, positive input of comparator 2013.

The register 2012 is programmable and stores the first value. The first value is applied to a second, for example, negative input of the comparator 2013.

In process S702, the comparator 2013 compares the count value provided by the counter 2011 to the first value provided by the register 2012. The output of the comparator 2013 changes state based on the result of the comparison, for example, when the count value exceeds the first value. Generally, a comparator is implemented with logic gate circuits. For example, a simple 1-bit comparator can be implemented by two NOT gates and two AND gates, and a multi-bit comparator can be implemented by cascading a plurality of simple comparators. In an embodiment, the comparator 2013 is implemented by connecting four 4-bit comparators in cascade and high bits are compared first. If a comparison is obtained, there is no need to compare low bits further.

The control module 2014 is coupled to the comparator 2013 to receive the output of the comparator 2013. If the comparison is satisfied, then in process S703, the control module 2014 connects the calibration element 202 to the oscillator 101; if the comparison is not satisfied, then in process S704, the control module 2014 disconnects the calibration element 202 from the oscillator 101.

In one embodiment, when the count value is less than or equals to the first value, the output of the comparator 2013 keeps a constant state, for example, logic low or logic high, and the calibration element 202 remains disconnected from the oscillator 101. Once the count value exceeds the first value, the output of the comparator 2013 changes state, for example, changes from logic low to logic high or from logic high to logic low, and thereby the control module 2014 connects the calibration element 202 to the oscillator 101. In an embodiment, the control module 2014 is an n-channel enhancement-mode MOSFET and the output of the comparator 2013 is applied on the gate of the MOSFET. When the output of the comparator 2013 is logic high, a conducting channel is formed between the source and the drain of the MOSFET and the calibration element 202 is connected to the oscillator 101. When the output of the comparator 2013 is logic low, the channel is cutoff and the calibration element 202 is disconnected from the oscillator 101. In alternative embodiments, a p-channel MOSFET, a bipolar junction transistor, or a diode can also be used.

In an embodiment, the calibration element 202 is a capacitive load including, for example, a capacitor or a plurality of capacitors. In an alternative embodiment, the calibration element 202 is an inductive load including, for example, an inductor or a plurality of inductors.

When the calibration element 202 is an equivalent parallel capacitive load as seen from the nodes of the oscillator 101, the frequency of the oscillating signal generated by the oscillator 101 will be slowed down. When the calibration element 202 is an equivalent series capacitive load as seen from the nodes of the oscillator 101, the frequency of the oscillating signal generated by the oscillator 101 will be speeded up. The capacitance of the capacitive load may be set so that $|f_1-f_2|>1$ Hz, for example, about 15 pF or 20 pF.

It is to be noted that the division ratio input into the frequency divider 102 depends on the configuration between the capacitive load and the oscillator 101. If the capacitive load is an equivalent parallel capacitive load, the division ratio of the frequency divider 102 is set to a value that is equal to the integer part of the resonant frequency of the oscillator 101. If the capacitive load is an equivalent series capacitive load, the division ratio of the frequency divider 102 is set to a value that is equal to the integer part of the resonant frequency of the oscillator 101 plus 1.

Hereinafter, for illustrative purposes only, operation of circuit 200 will be described using an equivalent parallel capacitive load as an illustrative example of the capacitive load. It shall be appreciated that a person of ordinary skill in the art can then fully appreciate the implementation/operation of circuit 200 and/or the related method in relation to an equivalent series capacitive load.

Further for illustrative purposes, assuming the measured resonant frequency of the oscillator 101 is 32771.45 Hz, the capacitance of the capacitive load is 20 pF, and the frequency, denoted as "$f_2$", of the oscillating signal generated by the oscillator 101 when the capacitive load is connected to the oscillator 101 is 32770.35 Hz. Then, the division ratio, denoted as "n", input into the frequency divider 102 is 32771, equal to the integer part of the resonant frequency of the oscillator 101.

The frequency divider 102 receives the oscillating signal with a frequency of 32771.45 Hz and divides the oscillating signal into a clock signal. The counter 2011 receives the oscillating signal generated by the oscillator 101 and the clock signal generated by the frequency divider 102, and counts oscillations in the oscillating signal and is reset in response to the clock signal, for example, at the rising edge or the falling edge of the clock signal. The comparator 2013 compares the count value output from the counter 2011 to the first value provided by the register 2012. The first value, denoted as "m", is 19365 that is equal to an integer closest to $f_1*(n-f_2)/(f_1-f_2)$, wherein, $f_1$=32771.45 Hz, $f_2$=32770.35 Hz, n=32771. In one embodiment, $f_2$ is a measured value when the calibration element 202 is connected to the oscillator 101.

When the count value is less than or equal to 19365, the output of the comparator 2013 keeps a constant state and the capacitive load is isolated from the oscillator 101, and the oscillator 101 outputs the oscillating signal with a frequency of 32771.45 Hz. When the count value exceeds 19365, the output of the comparator 2013 changes state and thereby the control module 2014 connects the capacitive load to the oscillator 101, which slows down the frequency of the oscillating signal generated by the oscillator 101, and the oscillator 101 outputs the oscillating signal with a frequency of 32770.35 Hz.

Figure 8:
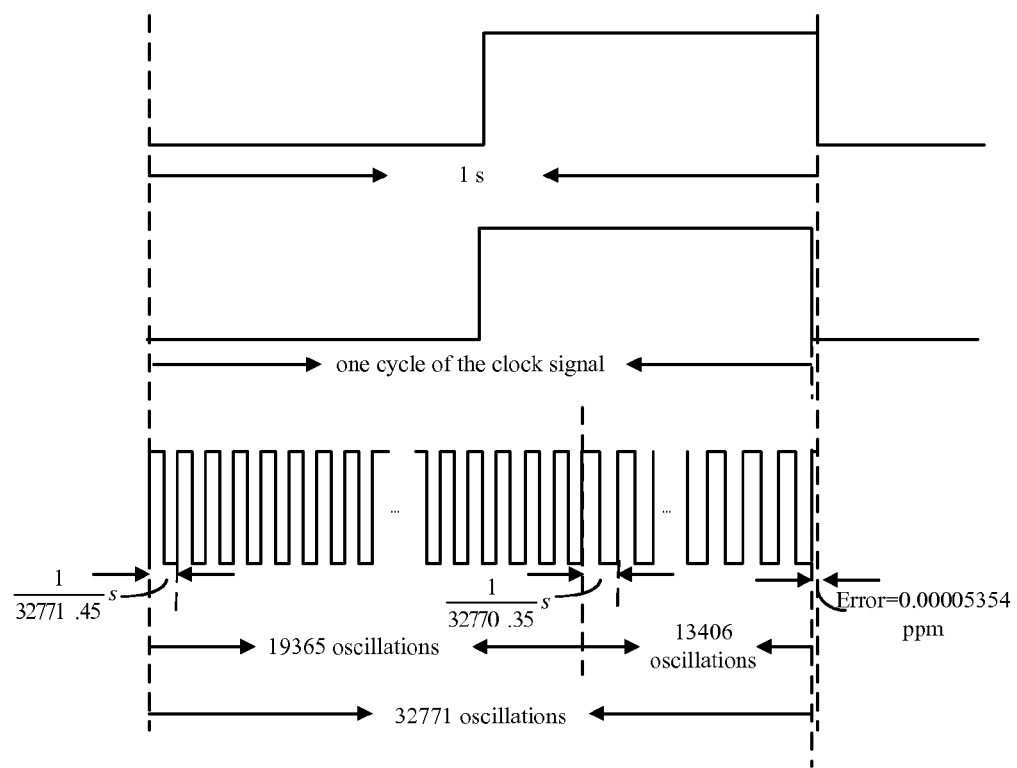
FIG. 8 illustrates the waveform of the clock signal of FIG. 6.

As shown in FIG. 8, during one cycle of the clock signal, the former 19365 oscillations in the oscillating signal generated by the oscillator 101 have a frequency of 32771.45 Hz and the latter 13406 oscillations, which is the difference between n and m, have a frequency of 32770.35 Hz. Therefore, the clock signal generated by the frequency divider 102 is with an approximate frequency of 1 Hz and the error of the clock signal is $$1-\left(\frac{m}{f_1}+\frac{n-m}{f_2}\right)=1-\left(\frac{19365}{32771.45}+\frac{13406}{32770.35}\right)\approx 0.00005354 \text{ ppm.}$$

In one embodiment, the circuit 100 shown in FIG. 1 and the circuit 200 shown in FIG. 4 and FIG. 6 are used in a real time clock device. Alternatively, the circuit 100 and the circuit 200 can also be used in, for example, a timer and signal synchronization applications.

Figure 9:
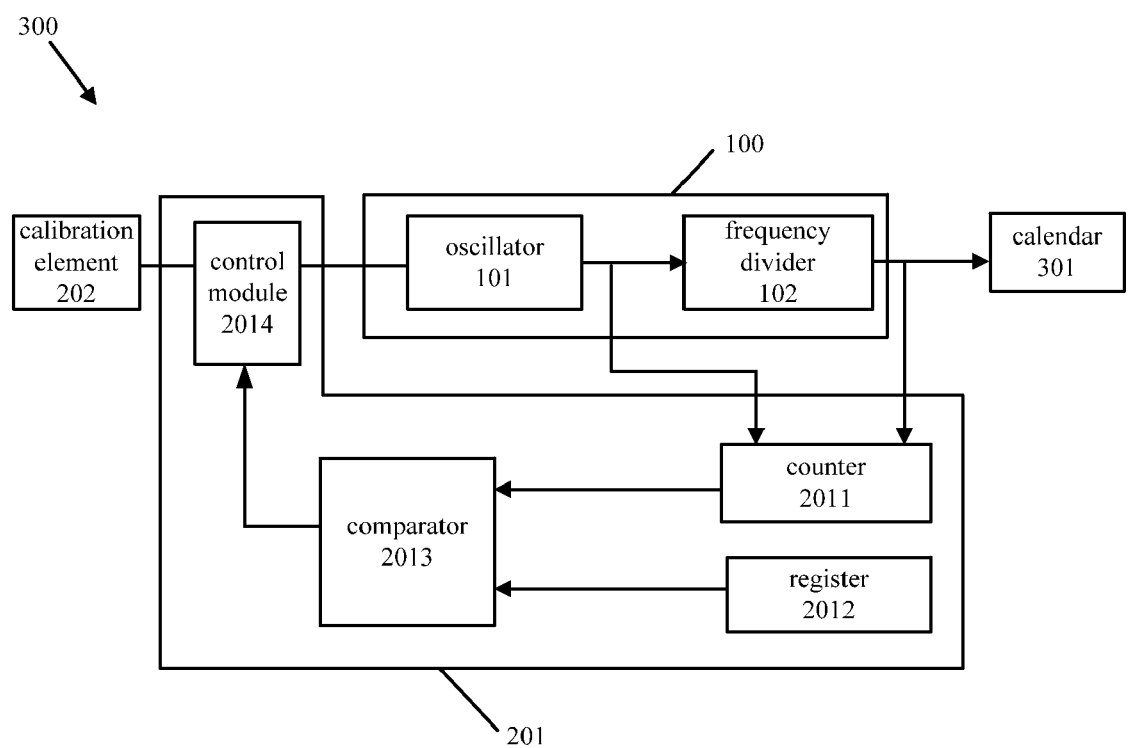
FIG. 9 illustrates a real time clock device according to an embodiment that comprises the circuit for generating a clock signal shown in FIG. 6.

FIG. 9 illustrates a real time clock device 300 according to an embodiment that comprises the circuit 200 shown in FIG. 6.

In FIG. 9, the real time clock device 300 further comprises a calendar 301 coupled to the frequency divider 102 and the clock signal generated by the frequency divider 102 is applied to the calendar 301. The calendar 301 updates its count in response to the clock signal, for example at the rising edge or the falling edge of the clock signal, and display time.

In the disclosure herein, operations of circuit embodiment(s) may be described with reference to method embodiment(s) for illustrative purposes. However, it should be appreciated that the operations of the circuits and the implementations of the methods in the disclosure may be independent of one another. That is, the disclosed circuit embodiments may operate according to other methods and the disclosed method embodiments may be implemented through other circuits.

It will also be readily understood by those skilled in the art that materials and methods may be varied while remaining within the scope of the present disclosure. It is also appreciated that the present disclosure provides many applicable inventive concepts other than the specific contexts used to illustrate embodiments. Accordingly, the appended claims are intended to include within their scope such processes, machines, manufacturing, compositions of matter, means, methods, or steps.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A circuit, comprising:
   a frequency divider configured to receive an oscillating signal generated by an oscillator and configured to divide the oscillating signal into a clock signal, wherein a division ratio of the frequency divider has a value equal to one of: an integer part of the resonant frequency of the oscillator and the integer part of the resonant frequency of the oscillator plus 1;
   a calibration element;
   a counter configured to count a number of oscillations that have transpired and to reset the counted number of oscillations in response to the clock signal;
   a comparator configured to compare the counted number of oscillations to a threshold value; and
   a control system coupled to receive an output of the comparator and configured to switchably connect the calibration element to the oscillator based on a comparison between the threshold value and the counted number of oscillations that have transpired from the oscillating signal.

2. The circuit of claim 1, wherein the threshold value is set to an integer closest to $f_1*(n-f_2)/(f_1-f_2)$, wherein $f_1$ is a frequency of the oscillating signal while the calibration element is isolated from the oscillator, $f_2$ is a frequency of the oscillating signal while the calibration element is connected to the oscillator, and n is the division ratio of the frequency divider.

3. The circuit of claim 2 wherein the control system includes:
   the counter coupled to receive the oscillating signal and the clock signal;
   a register configured to store and provide the threshold value; and
   the control module coupled to receive an output of the comparator and configured to switchably connect the calibration element to the oscillator when the counted number of oscillations exceeds the threshold value, the comparator being configured to isolate the calibration element from the oscillator while the counted number of oscillations does not exceed the threshold value.

4. The circuit of claim 3, wherein the counter is configured to be reset at one of: a rising edge and a falling edge of the clock signal.

5. The circuit of claim 2, wherein the calibration element is capacitive.

6. The circuit of claim 5, wherein the capacitance of the calibration element has a capacitance that cause the $|f_1-f_2|>1$ Hz.

7. The circuit of claim 1, further comprising the oscillator coupled to the frequency divider and configured to generate the oscillating signal and provide the oscillating signal to the frequency divider.

8. The circuit of claim 7, wherein the oscillator comprises a quartz crystal.

9. A real time clock device, comprising:
   an oscillator circuit configured to output a signal at a first frequency; and
   a circuit, including:
   a divider coupled to receive the signal and to output a clock;
   a calibration element;
   a counter configured to count a number of oscillations that have transpired and to reset the counted number of oscillations in response to the clock signal;
   a comparator configured to compare the counted number of oscillations to a threshold value; and
   a controller configured to receive an output of the comparator and switchably couple the calibration element to the oscillator based upon a number of counted oscillations that have transpired in the signal, wherein switchably coupling the calibration element to the oscillator changes the first frequency to a second frequency.

10. The real time clock device of claim 9 wherein the controller includes:
    a storage element configured to store the first threshold; and
    the comparator coupled to the storage element and the counter and configured to compare an output of the counter to the first threshold.

11. The real time clock device of claim 10 wherein the divider is configured to divide the first frequency by the integer portion of the first frequency, and the first threshold is approximately the first frequency*(the integer portion of the first frequency−the second frequency)/(the second frequency−the first frequency).

12. The real time clock device of claim 9 wherein a difference between the first frequency and the second frequency is greater than 1 Hz.

13. The real time clock device of claim 9, further comprising a calendar, wherein the calendar is coupled to receive the clock and configured to display time.

14. The real time clock device of claim 9 wherein the divider is programmable.

15. A method comprising:
    determining a resonant frequency of an oscillating signal generated by an oscillator; and
    dividing the oscillating signal into a clock signal according to a division ratio that has a value equal to one of: an integer part of the resonant frequency and the integer part of the resonant frequency plus 1;
    counting a number of oscillations that have transpired in the oscillating signal generated by the oscillator and resetting the counted number of oscillations in response to the clock signal;
    comparing the counted number of oscillations that have transpired to a threshold value; and
    controlling a connection between a calibration element and the oscillator based on the threshold value and the counted number of oscillations that have transpired from the oscillating signal generated by the oscillator.

16. The method of claim 15 wherein the threshold value is set to an integer closest to $f_1*(n-f_2)/(f_1-f_2)$, wherein $f_1$ denotes a frequency of the oscillating signal while the calibration element is disconnected from the oscillator, $f_2$ denotes a frequency of the oscillating signal while the calibration element is connected to the oscillator, and n denotes the division ratio.

17. The method of claim 16, wherein controlling the connection further comprises:
    connecting the calibration element while the counted number of oscillations is greater than the threshold value; and
    isolating the calibration element from the oscillator while the count value counted number of oscillations is not greater than the threshold value.

18. The method of claim 16, wherein the calibration element is capacitive.

19. The method of claim 18, wherein the capacitance of the calibration element has a capacitance that cause the $|f_1-f_2|>1$ Hz.

20. The method of claim 15, wherein the oscillator comprises a quartz crystal.

* * * * *

UNITED STATES PATENT AND TRADEMARK OFFICE
CERTIFICATE OF CORRECTION

PATENT NO.         : 8,344,814 B2
APPLICATION NO.    : 12/975125
DATED              : January 1, 2013
INVENTOR(S)        : Henry Ge It is certified that error appears in the above-identified patent and that said Letters Patent is hereby corrected as shown below:

<u>Column 8, Line 59</u>:
"the count value counted number of oscillations is not" should read, --the counted number of oscillations is not--.

Signed and Sealed this
Twelfth Day of February, 2013

Teresa Stanek Rea
*Acting Director of the United States Patent and Trademark Office*